(12) United States Patent
Harris et al.

(10) Patent No.: US 8,804,975 B2
(45) Date of Patent: Aug. 12, 2014

(54) DIGITAL SOUND LEVELING DEVICE AND METHOD TO REDUCE THE RISK OF NOISE INDUCED HEARING LOSS

(75) Inventors: John G. Harris, Gainesville, FL (US); Colleen Garbe Le Prell, Gainesville, FL (US); Qing Yang, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 532 days.

(21) Appl. No.: 13/148,534

(22) PCT Filed: Feb. 12, 2010

(86) PCT No.: PCT/US2010/024095
§ 371 (c)(1),
(2), (4) Date: Aug. 9, 2011

(87) PCT Pub. No.: WO2010/093917
PCT Pub. Date: Aug. 19, 2010

(65) Prior Publication Data
US 2011/0311067 A1    Dec. 22, 2011

Related U.S. Application Data

(60) Provisional application No. 61/152,506, filed on Feb. 13, 2009.

(51) Int. Cl.
*H03G 3/20* (2006.01)

(52) U.S. Cl.
USPC ............. 381/57; 381/71.1; 381/98; 381/101; 381/102; 381/103; 381/104; 381/107; 381/312

(58) Field of Classification Search
USPC ............ 381/71.1, 57, 98, 101, 102, 103, 104, 381/107, 312, 320
See application file for complete search history.

(56) References Cited

U.S. PATENT DOCUMENTS

| | | | |
|---|---|---|---|
| 5,495,529 A | 2/1996 | Honda | |
| 5,982,459 A | 11/1999 | Fandrianto et al. | |
| 6,456,199 B1 | 9/2002 | Michael | |
| 2002/0099870 A1 | 7/2002 | Miller et al. | |
| 2010/0014682 A1* | 1/2010 | Shin ............................. | 381/57 |

FOREIGN PATENT DOCUMENTS

| | | |
|---|---|---|
| JP | 2000-258239 | 9/2000 |
| JP | 2000-258240 | 9/2000 |

\* cited by examiner

*Primary Examiner* — Vivian Chin
*Assistant Examiner* — Paul Kim
(74) *Attorney, Agent, or Firm* — Saliwanchik, Lloyd & Eisenschenk, P.A.

(57) ABSTRACT

Devices and methods for digital sound leveling are disclosed. The subject devices and methods can be used to reduce the risk of noise induced hearing loss. According to an embodiment, an audio file can be parsed into frames that are filtered using an A-weighted digital filter and scaled to a desired power level. Accordingly, the dynamic range of an audio output at a particular volume level can be controlled.

20 Claims, 3 Drawing Sheets

DIGITAL SOUND LEVELING DEVICE AND METHOD TO REDUCE THE RISK OF NOISE INDUCED HEARING LOSS

CROSS-REFERENCE TO RELATED APPLICATIONS

This application is the U.S. national stage application of International Application Serial No. PCT/US10/24095, filed Feb. 12, 2010, which claims the benefit of U.S. Provisional Application Ser. No. 61/152,506, filed Feb. 13, 2009, which are hereby incorporated by reference in their entirety, including all figures, tables and drawings.

This invention was made with government support under NIDCD U01 DC008423 awarded by the National Institute of Health (NIH). The government has certain rights in the invention.

BACKGROUND OF THE INVENTION

Noise induced hearing loss can be caused by continuous exposure to loud sounds over an extended period of time. Any sound at or over 85 dB may cause noise induced hearing loss. More young people are developing noise induced hearing loss as the popularity of personal portable media and multimedia devices, such as mp3 players, cellular phones, smart phones, and portable game consoles, is growing. In particular, research indicates that people listening to audio signals through earphones or headphones with a personal portable media or multimedia device on a street or a noisy environment are in great danger of suffering from noise induced hearing loss.

Typical audio files contain a large dynamic range of sound levels. For example, the dynamic range for audio files on CDs is around 90 dB and the dynamic range for audio files on DVDs is around 120 dB. Listeners usually adjust the volume of a media or multimedia player device such that they can comfortably enjoy the lowest or average sound levels, thereby causing potential hearing risk during the loudest sound levels. The hearing risk is compounded with extended listening time, which is common with today's personal portable media players with memory or hard disks containing, literally, days of music.

In general, people adjust the volume of the music at their comfort level when they start to listen to music. Every listener's comfortable level is different. It could be loud or soft. After adjusting the volume, listeners will often keep listening at the same volume level no matter how loud the volume set-up because listeners' ears will adapt to the adjusted volume level quickly.

In addition, with the large dynamic range of most audio files, even a volume level that appears to be in a safe region can contain elements that extend into levels that can increase the risk of hearing loss.

Often in the search for safer volume levels, there is a trade-off between safety and overall listening experience.

Some commercial devices such as the Apple iPod have the capability to limit the instantaneous power output from the device. This is not a satisfactory solution primarily because of the inevitable clipping and distortion that occurs in the louder portions of the audio when the volume is increased to properly hear the softer portions. Also, the max dB sound level presented to the ear is a function of the headset and so cannot be set independently by the music file or playing device.

Another technique that has been in use for decades is to perform sound leveling between songs so that, for example, a CD can be burned from sources with inconsistent sound levels. More recently, audio players such as iTunes 7 have the capability to change the overall sound setting for each song using a number stored within the song data file. This reduces the dynamic range of a CD or play list but does not solve the problem of dynamic range variation within a song. Accordingly, research is ongoing for devices and methods that can reduce the risk of noise induced hearing loss.

BRIEF SUMMARY OF THE INVENTION

Embodiments of the present invention relate to digital sound leveling. According to certain embodiments, devices and methods to reduce the risk of noise induced hearing loss are provided.

According to an embodiment of the present invention, a digital sound leveling device reducing the risk of noise induced hearing loss can include: a parser for dividing an input audio digital signal having a first dynamic range into a plurality of frames; a digital filter for filtering each frame of the plurality of frames; a scaling unit receiving a filtered frame from the digital filter; and a reconstruction unit receiving each scaled filtered frame and recombining the scaled filtered frames to create an output audio digital signal having a second dynamic range.

According to another embodiment of the present invention, a method for leveling a digital sound to reduce the risk of noise induced hearing loss can include: dividing, or parsing, an input audio digital signal into a plurality of frames; filtering each frame with a digital filter; and scaling each filtered frame. The digital filter can include an A-Weighted filter. The filtered frames can be scaled such that the A-weighted power of each frame is set to a desired amount. The scaled filtered frames can be output for real-time digital audio file manipulation or recombined into a reconstructed audio data file that can be stored for later use.

The invention does not limit the instantaneous sound level of audio. Instead it reduces the dynamic range of the audio such that listening to the processed sound will likely cause less hearing damage than listening to the unprocessed audio at the same sound level.

In one implementation, real-time digital audio file manipulation can be integrated into any device or system for playing music.

In another implementation, a one-time digital audio file manipulation can be incorporated into a personal music file organizer or within a commercial distribution site.

DETAILED DISCLOSURE OF THE INVENTION

Embodiments of the present invention provide a device and method of audio sound automatic leveling and implementations thereof. Embodiments of the present invention can be used to reduce the risk of noise induced hearing loss that occurs from listening to audio.

According to an embodiment of the present invention, digital sound leveling can be accomplished with minimal degradation effects, including distortion. Advantageously, the dynamic range of sound levels found in audio files can be reduced such that the loudest sound levels a listener will receive can be more safely provided. In a specific embodiment, the dynamic range of sound of audio files played through earphones or headphones can be reduced and the overall audio can be maintained at a safe sound level, for example, below 85 dB.

In an embodiment, the leveling procedure normalizes the sound power throughout an audio track such that the noise power in each window is constant. An appropriate choice of the window length is one important characteristic because too small a window will cause severe distortion while too long a window will not reduce the dynamic range enough.

Figure 1:
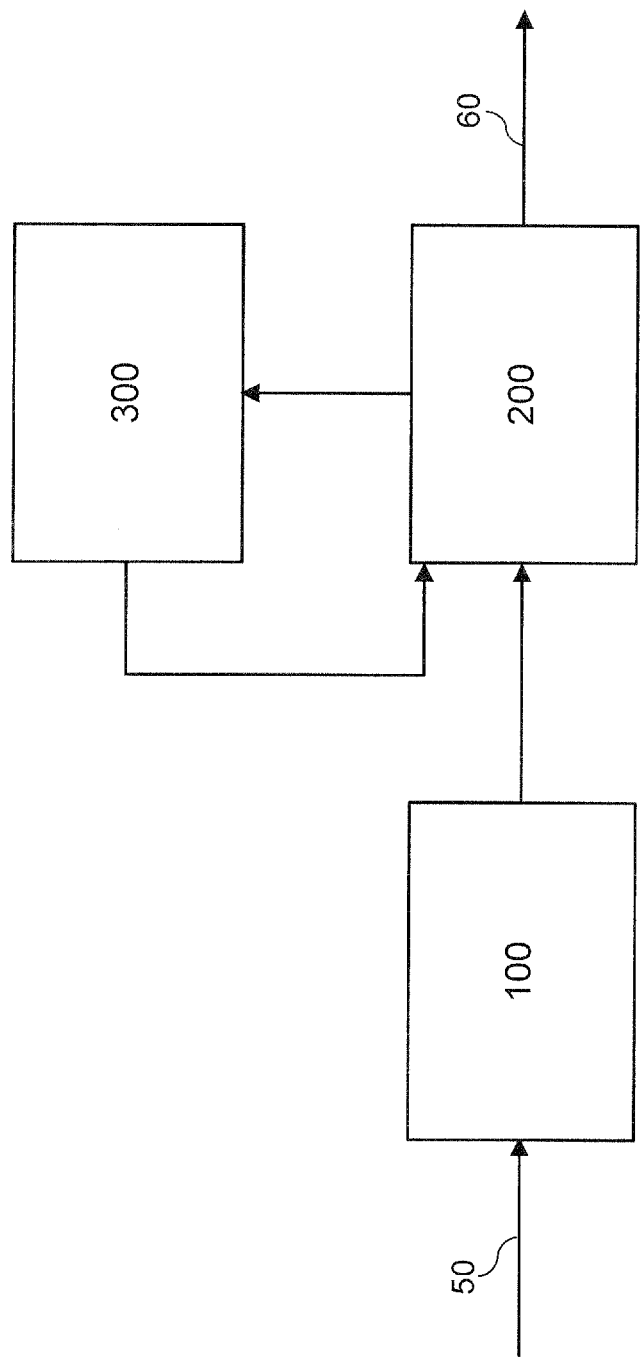
FIG. 1 shows a schematic diagram of an embodiment of the present invention.

Referring to FIG. 1, sound leveling can be accomplished using a parsing component 100 to parse audio data 50 into overlapping or non-overlapping frames, a filter component 200 for applying a digital filter, such as an A-weighted digital filter, to each frame, and a scaling component 300 that scales the filtered data. The scaling component 300 can scale each filtered frame using a calculated original A-weighted power level of the filter output for each frame. The original power level of the A-weighted filtered frame can be calculated using RMS (Root Mean Square), Root Mean Fourth, or some other higher power. Alternatively, Kurtosis of the distribution of the filtered signal can be utilized for the scaling. The scaled filtered data frames can then be recombined to create a leveled output 60.

Figure 2:
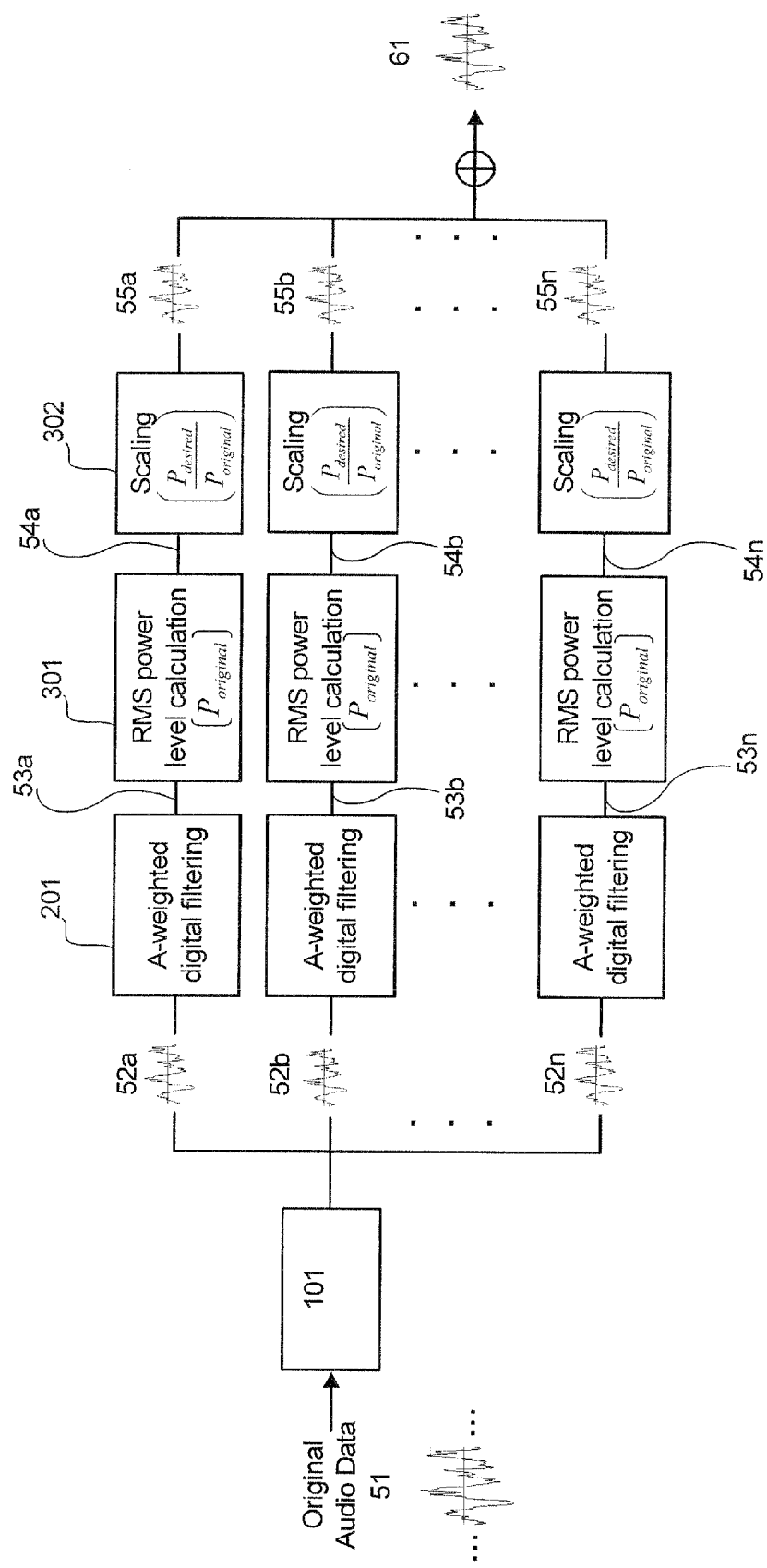
FIG. 2 shows a block diagram of digital sound leveling in accordance with an embodiment of the present invention.

FIG. 2 shows a block diagram for sound leveling in accordance with an embodiment of the present invention.

In one embodiment, the parsing 101 of the audio data 51 can be used to break the audio data into 50 ms, non-overlapping frames or windows 52a-n.

An A-weighted digital filter 201 can be applied to each frame 52a-n. The A-weighted digital filter can be a digital filter obtained from transforming a design of an analog filter based on the definition of A-weighting given in the IEC/CD 1672 standard. The A-weighted digital filter provides an approximation of loudness, and can be used to correct the sound pressure levels to more accurately reflect what human ears perceive. The transform can be a bilinear transform for a user-defined sample rate such as 44100 Hz, which is a typical sample rate for audio files.

After calculating the original RMS (root mean square) power level 301 of the filter output for each frame 53a-n, the data frames 54a-n can undergo a scaling 302 by $P_{desired}/P_{original}$ such that the A-weighted power of each frame is set to the desired amount. In other implementations, the original power level of the A-weighted filtered frame can be calculated using Root Mean Fourth, some other higher power, or Kurtosis of the signal distribution in order to take into account the damaging effects of the peaks in the audio data 51. The processed frames 55a-n can be combined to reconstruct the music data 61. The processed frames can be output in real-time, or recombined and stored for later use.

In a specific embodiment, the parsed audio data can be obtained from audio wave files (.WAV). For such embodiments, an additional pre-processing step can be included when the original form of the data is not .WAV. For example, analog-to-digital converters and/or digital-to-digital converters can be used. The digital-to-digital converters can be software conversion algorithms that can convert files such as .MP3 to .WAV. Further data conversion steps can be utilized to obtain a desired audio output type after performing the leveling procedure.

According to an implementation, the absolute volume level for an audio device can remain in the control of the listener. Instead of limiting volume level, certain embodiments of the present invention only control the dynamic range of the sound. By reducing the dynamic range, the high-end exposure can be minimized. Therefore, the risk of noise induced hearing loss can be reduced. The reduction of high-end dynamic range exposure can be accomplished without reducing the volume level. That is, the leveled music compared to the original recording at the same volume level can provide a lower high-end dynamic range exposure.

Figure 3:
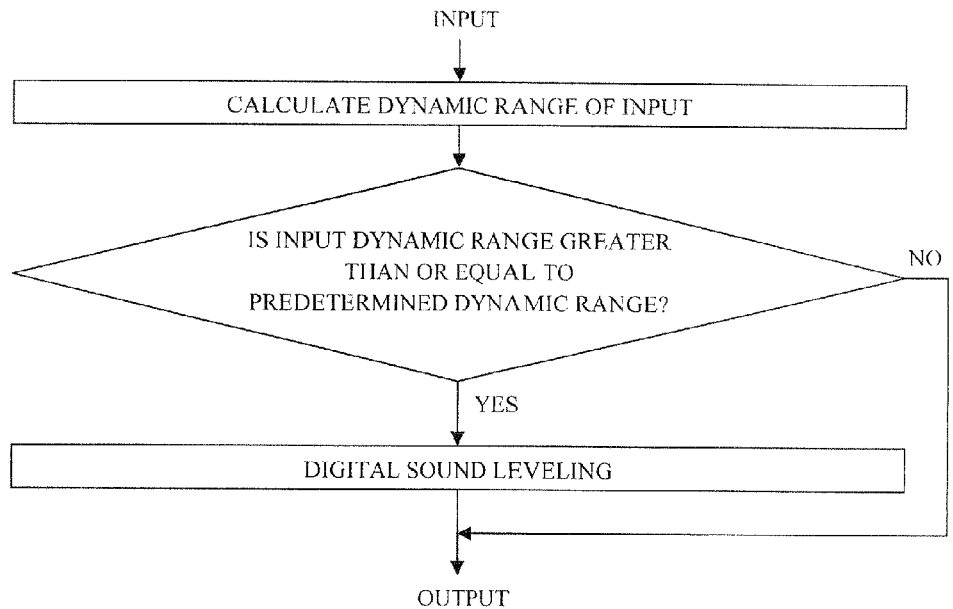
FIG. 3 is a flowchart of a digital sound leveling method in accordance with an embodiment of the present invention.

In certain applications, the subject digital signal leveling can be selectively applied depending on the dynamic range of an audio file. For example, FIG. 3 illustrates a digital sound leveling method in accordance with an embodiment of the present invention. According to such an embodiment, the dynamic range of an audio input is calculated. Then, if the dynamic range of the input is greater than or equal to a predetermined dynamic range, a digital sound leveling in accordance with embodiments of the present invention is performed. During the digital sound leveling, a parsing, filtering, and scaling of the audio input is accomplished. On the other hand, if the dynamic range of the input is less than the predetermined dynamic range, the digital sound leveling is not performed. Therefore, the dynamic range of an output is maintained within a safer level such that noise exposure is reduced at the same average listening levels. The predetermined dynamic range can be determined based on a safe sound level, for example, below 85 dB or using whatever existing standards are appropriate.

Figure 4:
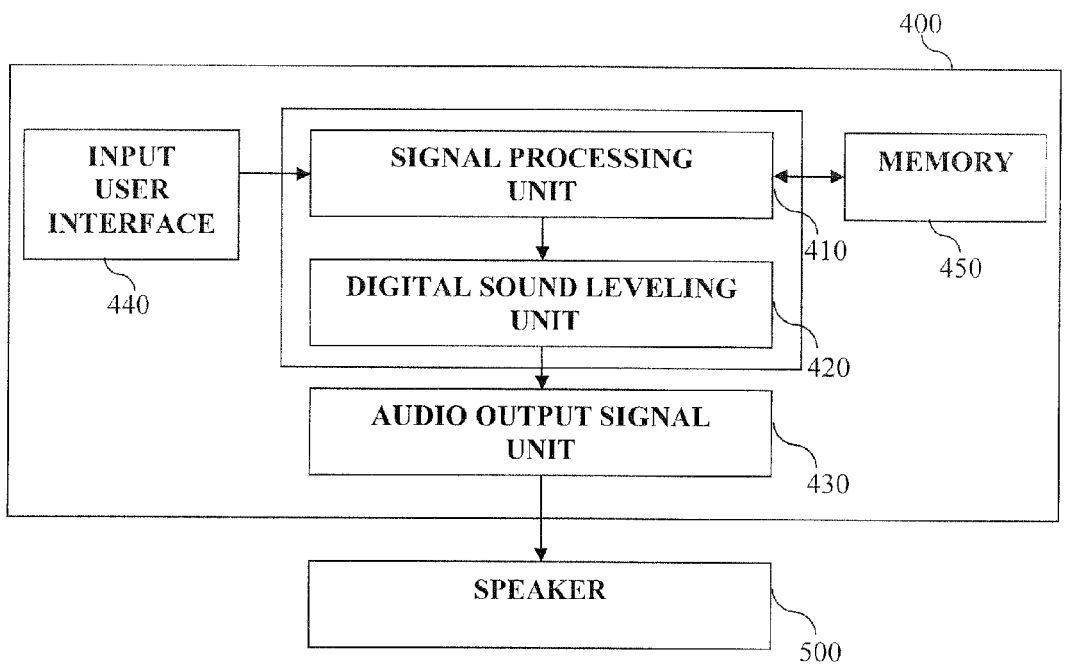
FIG. 4 shows a schematic diagram of a portable media player in accordance with an embodiment of the present invention.

Embodiments of the present invention can be implemented in many products for a variety of applications. In one application, a real-time digital audio file manipulation performed in accordance with an embodiment of the present invention can be integrated into devices that play audio, including but not limited to music players, radios, cellular phones, and smart phones. FIG. 4 shows a block diagram of a portable media/multimedia device in accordance with an embodiment of the present invention. As shown in FIG. 4, the device can include a main body 400 and a speaker 500. In one embodiment, the speaker 500 can be in the form of an earphone or headphone. In another embodiment, the speaker 500 can be a component of the main body 400.

The main body 400 can include a signal processing unit 410, a digital sound leveling unit 420, an audio output signal unit 430, an input user interface 440, and a memory 450. One or more of these components can be incorporated at different positions within and through packaging of the main body 400. For example, a printed circuit board can be disposed within the package of the main body to provide circuits and/or other processing components containing, for example, the signal processing unit 410, the digital sound leveling unit 420, the audio output signal unit 430, and the memory 450 in addition to input ports for signals received from the input user interface 440. One or more of the signal processing unit 410, the digital sound leveling unit 420, and the audio output signal unit 430 may be provided in a single chip.

The input user interface 440 can be activated by buttons, a touch screen, or a user's voice. The buttons or the touch screen can include numeric/alphanumeric keys and a plurality of function keys. Although not shown, the device may include a sensor or receiver for remote control. In such implementations, a user can remotely control the device using a remote control.

In a specific embodiment, the memory 450 is formed of a read only memory (ROM) and/or a random access memory (RAM). The memory 450 is used to store media content, such as but not limited to music and movies. In addition, program software for the portable media device may be stored at locations within the memory 450.

In operation, the signal processing unit 410 receives a media content selected by a user through manipulating the input user interface 440. The media content may be a song selected from the memory 450.

The signal processing unit 410 is used to perform programmed functions and may provide pre-processing of the selected media content. For example, in one embodiment, the signal processing unit calculates a dynamic range of the selected media content and determines whether the calculated dynamic range of the selected media content exceeds or is equal to a predetermined dynamic range.

The digital sound leveling unit 420 receives the media content having a dynamic range greater than the predetermined dynamic range and adjusts the current dynamic range of the media content to a dynamic range below the predetermined dynamic range. In a specific embodiment, the digital sound leveling unit 420 includes the parsing component 100, the filter component 200, and the scaling component 300 as described with respect to FIG. 1 and/or FIG. 2.

The audio output signal unit 430 recombines frames filtered and scaled by the digital sound leveling unit 420 to create a leveled media content with a safer dynamic range.

The speaker 500 plays the leveled media content received from the audio output signal unit 430 or unprocessed media content. Therefore, a user's hearing can be protected because a media content is always played with a safer dynamic range through the speaker 500.

The audio file manipulation using the subject leveling procedure can also be incorporated into sound amplification systems for real-time sound leveling in venues such as theaters, automobiles, discos, concert halls, and homes. In another application, a one-time digital audio file manipulation performed in accordance with an embodiment of the present invention can be integrated into a personal music file organizer or within a commercial distribution site.

In yet another application, the subject leveling procedure can be used as an offline post-processing step applied to the sound on CDs and DVDs (or other media capable of audio storage) before they are manufactured. In addition, the subject leveling procedure can be a processing step applied to music and video files before the files are downloaded over the internet or cellular phone networks.

A greater understanding of the present invention and of its many advantages may be had from the following example, given by way of illustration. The following description is illustrative of some of the methods, applications, embodiments and variants of the present invention. It should, of course, not to be considered in any way limitative of the invention. Numerous changes and modifications can be made with respect to the invention.

EXAMPLE 326 rock and pop songs (21.7 hours) were obtained and analyzed for their average song level as shown in Table 1. Average song level is the average level in any given single song. That level is determined by the two things. First, the level at which the song was synthesized during the recording and engineering process. And second, the volume at which the song is played. The first is controlled by the audio producer, but the second can be controlled by the listener. To obtain the measurements, a single volume setting was used for playback of all the songs.

TABLE 1

| | Rock | Pop |
|---|---|---|
| Number of Songs | 171 | 155 |
| Total Duration | 11.55 hours | 10.1 hours |
| Song Duration | 4.10 ± 0.9 min | 3.91 ± 0.8 min |
| Average Song Level | 98.9 ± 3.5 dB A | 97.5 ± 3.1 dB A |
| Range of Average Song Levels | 82.0-106.2 dB A (24.2 dB range) | 86.9-104.5 dB A (17.6 dB range) |
| Within Song Level Variation | 4.9 ± 1.6 dB | 5.5 ± 1.6 dB |
| Peak Song Level | 107.4 ± 2.4 dB A | 107.7 ± 2.4 dB A |

Table 1 clearly illustrates the variability both within and across songs. From this table, it is clear that at a given volume, the sound a listener is exposed to varies considerably across time.

In this example procedure, all songs were digitally manipulated using Matlab programs, during which the music files were broken into 50 ms windows, filtered using an A-weighted function, and then level equated. Although Matlab was used here, the data can be manipulated using other software programs or through using hardware components.

Prior to the Matlab processing, the average level of individual songs had a 16 dB range and average level variation within each song was 4.6 dB.

Normalizing across the song library, including within individual songs was accomplished by reducing the average song level during the processing procedure such that the average level of individual songs had a 3 dB range and within-song variation was reduced to 2.3 dB. Here, the songs were sampled and an A-weight filter applied. The power was then reduced such that each song contained the same amount of power. Therefore, after reducing the level of each song by some song-specific amount, the average level of the songs was made much more consistent across songs. In addition, because the power was sampled in 50 ms windows across the entire duration of the song (50% overlap in windows), the amount of variation across each song is also reduced.

From the example study, kurtosis, which has had a considerable effect on threshold changes in animal noise studies, was reduced. Advantageously the above described procedure can be beneficial in the development of routine exposure parameters that facilitate direct comparisons across human clinical trials for clinicians who use evidence-based practice in counseling their patients.

According to embodiments of the present invention, a safer listening environment can be provided while minimizing the loss of audio quality.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A digital sound leveling device reducing the risk of noise induced hearing loss, comprising:
    a parser for parsing an input audio digital signal having a first dynamic range into a plurality of frames;
    a digital filter for filtering each frame of the plurality of frames;

a scaling unit receiving a filtered frame from the digital filter; and a reconstruction unit receiving each scaled filtered frame and recombining the scaled filtered frames to create an output audio digital signal having a second dynamic range.

2. The digital sound leveling device according to claim 1, further comprising a speaker receiving the output audio digital signal and outputting a leveled audio signal.

3. The digital sound leveling device according to claim 1, further comprising:

a receiver for receiving an input audio signal having the first dynamic range; and a preprocessor for converting the input audio signal to the input audio digital signal.

4. The digital sound leveling device according to claim 1, wherein the first dynamic range is larger than the second dynamic range.

5. The digital sound leveling device according to claim 1, wherein each frame is non-overlapped with an adjacent frame.

6. The digital leveling device according to claim 1, wherein each frame is overlapped with an adjacent frame.

7. The digital leveling device according to claim 1, wherein the digital filter comprises an A-Weighted digital filter.

8. The digital sound leveling device according to claim 7, wherein the A-weighted digital filter is a digital filter obtained from a transform of a design of an analog filter based on the definition of A-weighting given in the IEC/CD 1672 standard.

9. The digital sound leveling device according to claim 1, wherein the scaling unit comprises a first calculation unit for calculating an original power level of the filtered frame and a second calculation unit for multiplying the filtered frame by a ratio of a constant power level and the original power level of the filtered frame.

10. The digital sound leveling device according to claim 9, wherein the original power level of the filtered frame is calculated by RMS (Root Mean Square) power level.

11. The digital sound leveling device according to claim 9, wherein the original power level of the filtered frame is calculated using Root Mean Fourth or Kurtosis of the filtered frame's signal distribution.

12. A method for leveling a digital sound to reduce the risk of noise induced hearing loss, comprising:

parsing an input audio digital signal into a plurality of frames;

filtering each frame with a digital filter; and scaling each filtered frame.

13. The method according to claim 12, wherein a selected frame of the plurality of frames is non-overlapped with an adjacent frame to the selected frame.

14. The method according to claim 12, wherein a selected frame of the plurality of frames is overlapped with an adjacent frame to the selected frame.

15. The method according to claim 12, wherein the digital filter comprises an A-Weighted digital filter.

16. The method according to claim 15, wherein the A-weighted digital filter is a digital filter obtained from a transform of a design of an analog filter based on the definition of A-weighting given in the IEC/CD 1672 standard.

17. The method according to claim 12, wherein the scaling of each filtered frame comprises scaling each frame by a constant power level and the reciprocal of an original power level of the filtered frame being scaled.

18. The method according to claim 17, wherein the original power level of the filtered frame being scaled is calculated by RMS (Root Mean Square) power level.

19. The method according to claim 17, wherein the original power level of the filtered frame is calculated using Root Mean Fourth or Kurtosis of the filtered frame's signal distribution.

20. The method according to claim 12, further comprising recombining the scaled filtered frames.

* * * * *